(12) United States Patent
Kijima

(10) Patent No.: US 10,109,977 B2
(45) Date of Patent: Oct. 23, 2018

(54) LASER LIGHT SOURCE DEVICE

(71) Applicant: MITSUBISHI ELECTRIC CORPORATION, Tokyo (JP)

(72) Inventor: Takumi Kijima, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/579,149

(22) PCT Filed: Dec. 9, 2015

(86) PCT No.: PCT/JP2015/084499
§ 371 (c)(1),
(2) Date: Dec. 1, 2017

(87) PCT Pub. No.: WO2017/017864
PCT Pub. Date: Feb. 2, 2017

(65) Prior Publication Data
US 2018/0166851 A1    Jun. 14, 2018

(30) Foreign Application Priority Data

Jul. 28, 2015    (JP) .................. 2015-148217

(51) Int. Cl.
| | | |
|---|---|---|
| H01S 5/022 | (2006.01) | |
| G03B 21/20 | (2006.01) | |
| F21S 2/00 | (2016.01) | |
| F21V 19/00 | (2006.01) | |
| H01S 5/40 | (2006.01) | |

(52) U.S. Cl.
CPC .......... *H01S 5/02236* (2013.01); *F21S 2/00* (2013.01); *F21V 19/00* (2013.01); *G03B 21/2033* (2013.01); *H01S 5/022* (2013.01); *H01S 5/02288* (2013.01); *H01S 5/4025* (2013.01)

(58) Field of Classification Search
CPC ............... H01S 5/4025; H01S 5/02236; H01S 5/02288; G03B 21/2033; G03B 21/2046; F21V 19/0015
See application file for complete search history.

(56) References Cited

U.S. PATENT DOCUMENTS

| | | | |
|---|---|---|---|
| 8,348,461 B2 * | 1/2013 | Wilcox | F21S 2/005 362/240 |
| 9,401,581 B2 * | 7/2016 | Tamura | H01S 5/02236 |
| 2013/0038842 A1 * | 2/2013 | Zakoji | G03B 21/2013 353/30 |
| 2014/0198509 A1 | 7/2014 | Takiguchi et al. | |

FOREIGN PATENT DOCUMENTS

| | | |
|---|---|---|
| JP | 59-141664 U | 9/1984 |
| JP | 10-31138 A | 2/1998 |
| JP | 2012-108292 A | 6/2012 |
| JP | 2012-142102 A | 7/2012 |
| JP | 2013-138086 A | 7/2013 |
| JP | 2014-131002 A | 7/2014 |
| JP | 2014-138116 A | 7/2014 |

* cited by examiner

*Primary Examiner* — Karabi Guharay
(74) *Attorney, Agent, or Firm* — Birch, Stewart, Kolasch & Birch, LLP

(57) ABSTRACT

An optical unit is retained by a hole provided at a base member. The optical unit includes a laser light emitting element and a lens. The base member is provided with a guide part that is used for determining the position of the laser light emitting element in the hole of the base member.

7 Claims, 10 Drawing Sheets

F I G. 3
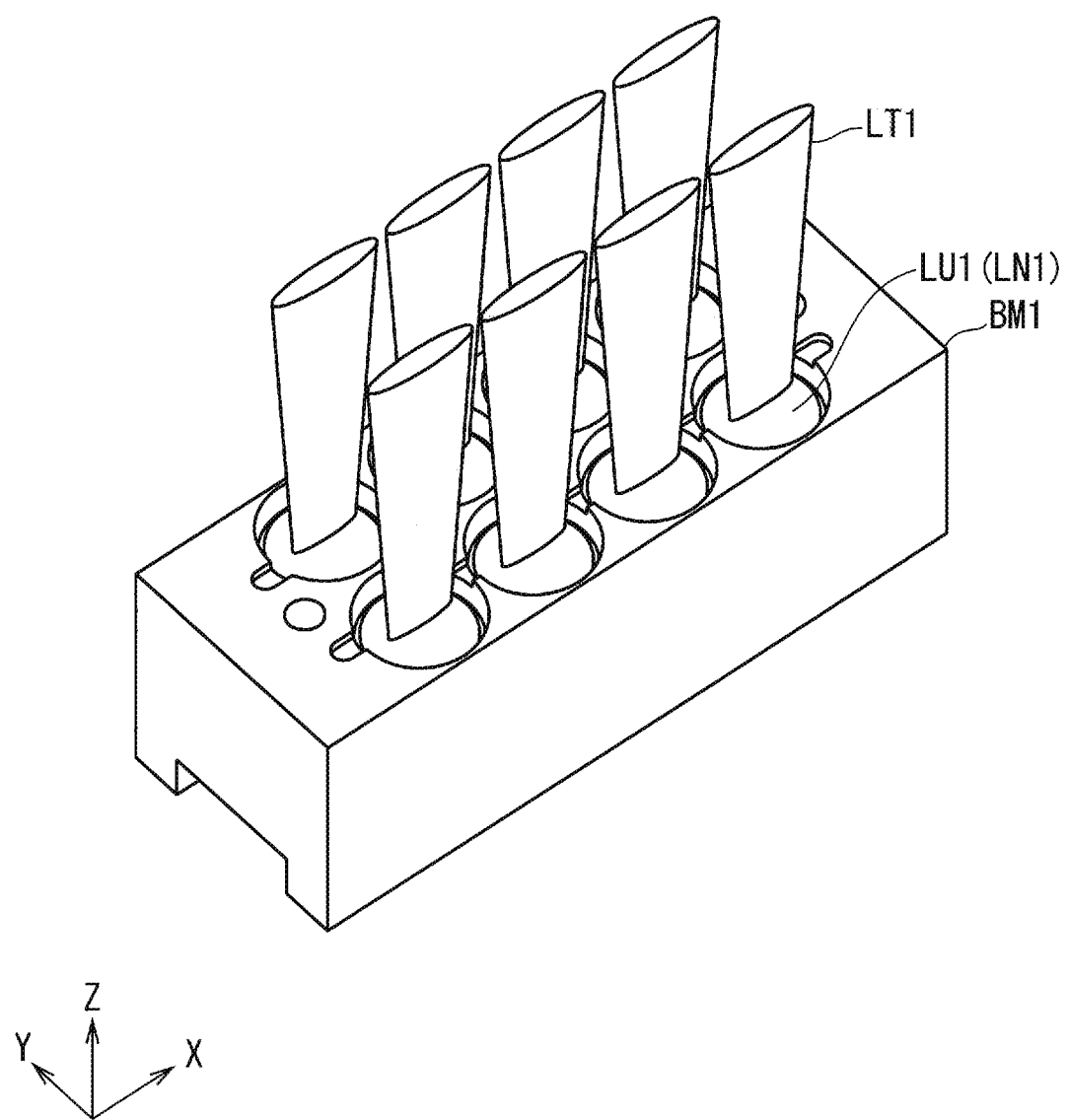

FIG. 7
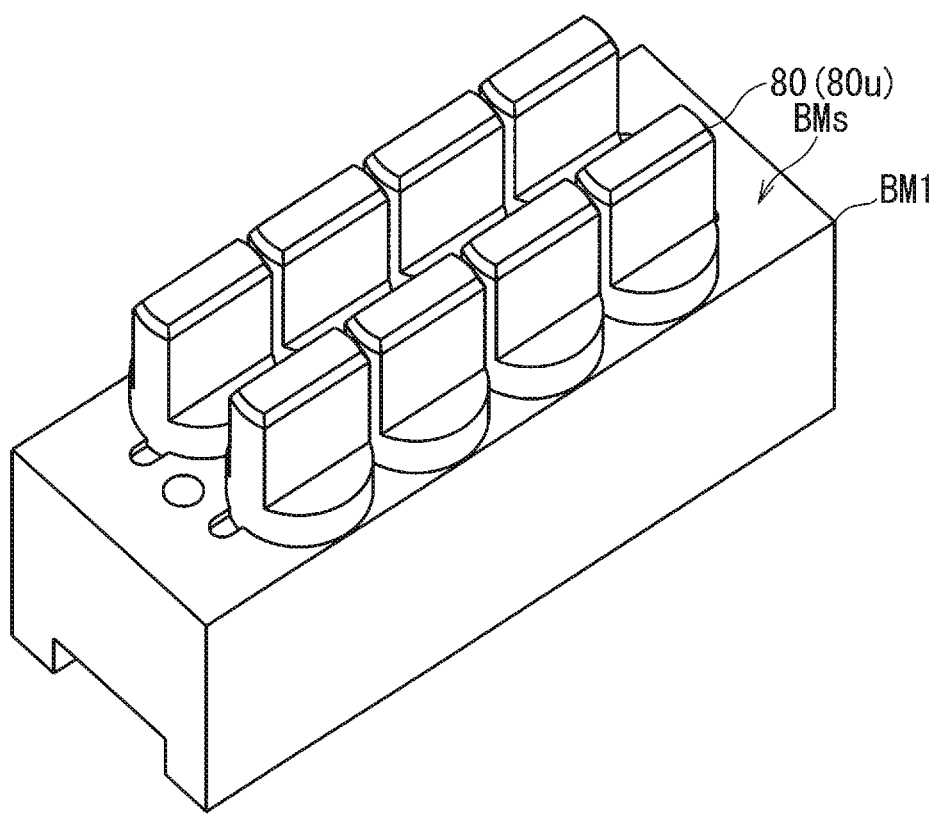
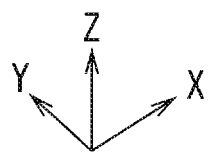

LASER LIGHT SOURCE DEVICE

TECHNICAL FIELD

The present invention relates to a laser light source device that emits laser light.

BACKGROUND ART

In recent years, with a projector that projects an image on a large screen, an increase in luminance of light that forms the image is desired. The use of the projector is, for example, use in digital cinema, use in a conference hall, use in performing projection mapping outdoors.

In the case where the use of the projector is for digital cinema, as the projector, a laser projector that includes a laser light source device has been actively employed. Accordingly, it is desired to increase the luminance of laser light that the laser light source device emits.

In general, there are limitations on an increase in luminance of laser light that a single laser light emitting element emits. Therefore, with a laser projector, by efficiently combining beams of laser light emitted by a plurality of laser light emitting elements, respectively, an increase in luminance of the laser light that the laser light source device emits is realized.

In such a light source device such as a laser light source device, normally, optical components such as a lens, a polarizing plate and the like are disposed in front of the light source such as a laser light emitting element. In the state in which the optical components are disposed so as to correspond to a plurality of laser light emitting elements, it is critical to highly precisely control the following optical characteristics. The optical characteristics are the orientation of the optical axis, parallelism of each of the laser light beams emitted by each of the laser light emitting elements, the light distribution characteristic and the like.

Patent Document 1 discloses a technique of highly precisely fixing a light source for controlling the optical characteristics (hereinafter also referred to as "the related art A"). Specifically, in the related art A, a light source supporting member includes a fitting part that fits with a light source (a laser element), and an insert hole into which a screw is inserted. Between the fitting part and the insert hole, an extending part is provided. The extending part is structured to suppress transmission of stress to the fitting part, which stress occurs when the screw is inserted into the insert hole. Thus, a reduction in stress applied to the fitting part is realized.

Patent Document 2 discloses a technique of highly precisely adjusting the optical axis of a light source unit (the optical characteristic) (hereinafter also referred to as "the related art B"). Specifically, in the related art B, a light source retaining member retains a light source (a laser element) and a collimator lens. The light source retaining member is housed in the base member.

PRIOR ART DOCUMENTS

Patent Documents

Patent Document 1: Japanese Patent Application Laid-Open No. 2012-142102
Patent Document 2: Japanese Patent Application Laid-Open No. 2013-138086

SUMMARY

Problems to be Solved by the Invention

In connection with a light source device, it is desired to minimize the number of components of the structure that fixes the light source to the base member in order to realize a reduction in costs. In the related art A, the light source (the laser element) is fixed to the base member using a screw. Accordingly, there exists a problem that the number of components increases by the screw in the structure that fixes the light source to the base member.

Further, in the related art B, the light source (the laser element) is fixed to the base member using a light source retaining member. Accordingly, in the structure that fixes the light source to the base member, there exists a problem that the number of components increases by the light source retaining member. Note that, in the case where the light source is fixed to the base member, the position of the light source in the base member must be determined.

The present invention has been made in order to solve such problems, and an object thereof is to provide a laser light source device with which the position of a light source in a base member can be determined with a minimum number of components of the structure that fixes the light source to the base member.

Means to Solve the Problems

In order to achieve the above-described object, a laser light source device according to one aspect of the present invention includes an optical unit that emits laser light and a base member, wherein the optical unit includes a laser light emitting element that emits the laser light and a lens through which the laser light transmits, the base member is provided with a hole for retaining the optical unit, and the base member is further provided with a guide part for determining a position of the laser light emitting element in the hole, a portion in the base member that is in contact with the hole is provided with a retaining part that retains the laser light emitting element of the optical unit, the guide part and the hole are provided at a main surface of the base member, the guide part is in contact with the hole, the laser light emitting element is inserted into the hole, the laser light emitting element is an element that is inserted into the hole by a jig for inserting the laser light emitting element into the hole, the guide part has a shape for fitting with a portion of the jig, a shape of the guide part as seen in a plan view is elongated, a shape of the hole as seen in a plan view is a circle, and the guide part is provided at the base member so as to extend along a long-side direction of the guide part and so as to prevent a center line that passes through a center in a short-side direction of the guide part from overlapping with a center of the hole as seen in a plan view.

Effects of the Invention

According to the present invention, the optical unit is retained by a hole provided at the base member. The optical unit includes a laser light emitting element and a lens. Therefore, the hole provided at the base member has a function of retaining the laser light emitting element as a light source. Note that, the laser light emitting element is a light source that emits laser light.

Thus, in the structure that fixes a laser light emitting element being a light source to a base member, the necessity of separately providing a member as in the conventional technique is eliminated. Accordingly, the number of components of the structure that fixes the light source to the base member can be minimized.

Further, the base member is provided with a guide part that is used for determining the position of the laser light emitting element in the hole of the base member.

From the foregoing, the position of the light source in the base member can be determined with a minimum number of components of the structure that fixes the light source to the base member.

The object, characteristics, modes, and advantages of the present invention become more apparent by the following detailed description and accompanying drawings.

BRIEF DESCRIPTION OF DRAWINGS

FIG. 3 is a perspective view showing the state in which optical units are emitting laser light.

FIG. 7 is a diagram showing the structure in a jig-inserted state.

DESCRIPTION OF EMBODIMENTS

Figure 1:
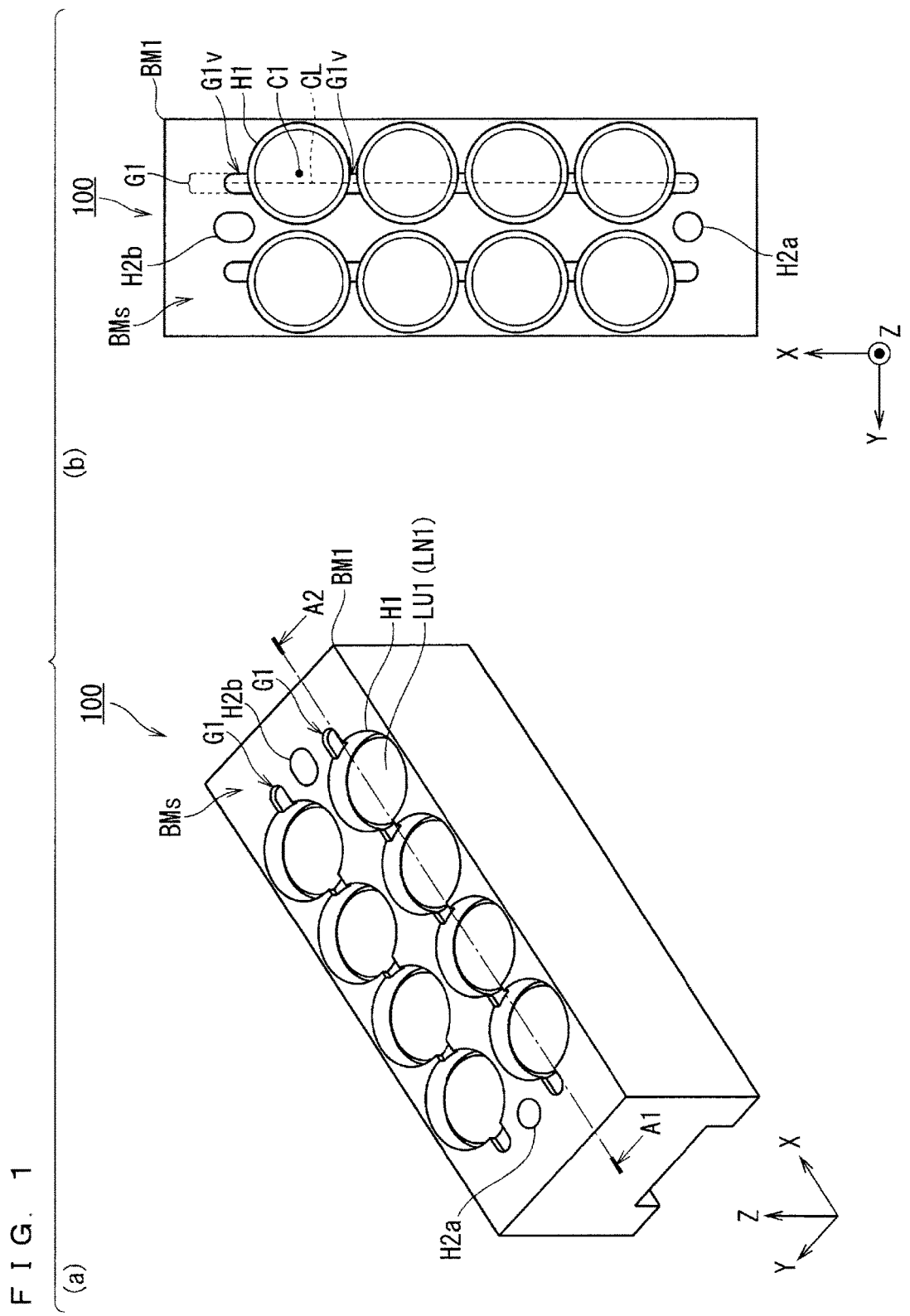
FIG. 1 is a diagram showing the structure of a laser light source device according to a first embodiment of the present invention.

In the following, with reference to the drawings, a description will be given of embodiments of the present invention. In the drawings referred to in the following, identical constituents are denoted by an identical reference character. The constituents denoted by an identical reference character have common name and function. Therefore, a detailed description of part of those constituents denoted by an identical reference character may be omitted.

Note that, the dimensions, material, shape, and relative disposition of each of the constituents exemplarily shown in the embodiments may be modified as appropriate depending on the structure of a device to which the present invention is applied, various conditions and the like. Further, the dimensions of the constituents in the drawings may differ from actual dimensions.

<First Embodiment>

FIG. 1 is a diagram showing the structure of a laser light source device 100 according to a first embodiment of the present invention. Part (a) in FIG. 1 is a perspective view of the laser light source device 100. Part (b) of FIG. 1 is a plan view of the laser light source device 100.

The laser light source device 100 is a device that emits laser light LT1. The laser light source device 100 is, for example, a device that is used as a light source of a projector. That is, the laser light source device 100 is attached to a projector. Hereinafter, a device to which the laser light source device 100 is attached is also referred to as "the attachment-target device".

In FIG. 1, X direction, Y direction, and Z direction are perpendicular to one another. In the subsequent drawings also, X direction, Y direction, and Z direction are perpendicular to one another. Hereinafter, a direction that includes X direction and a direction opposite to X direction (−X direction) is also referred to as "X-axis direction". Still further, hereinafter, a direction that includes Y direction and a direction opposite to Y direction (−Y direction) is also referred to as "Y-axis direction". Still further, hereinafter, a direction that includes Z direction and a direction opposite to Z direction (−Z direction) is also referred to as "Z-axis direction".

Further, hereinafter, a plane that includes X-axis direction and Y-axis direction is also referred to as "XY plane". Still further, hereinafter, a plane that includes X-axis direction and Z-axis direction is also referred to as "XZ plane". Still further, hereinafter, a plane that includes Y-axis direction and Z-axis direction is also referred to as "YZ plane".

Figure 2:
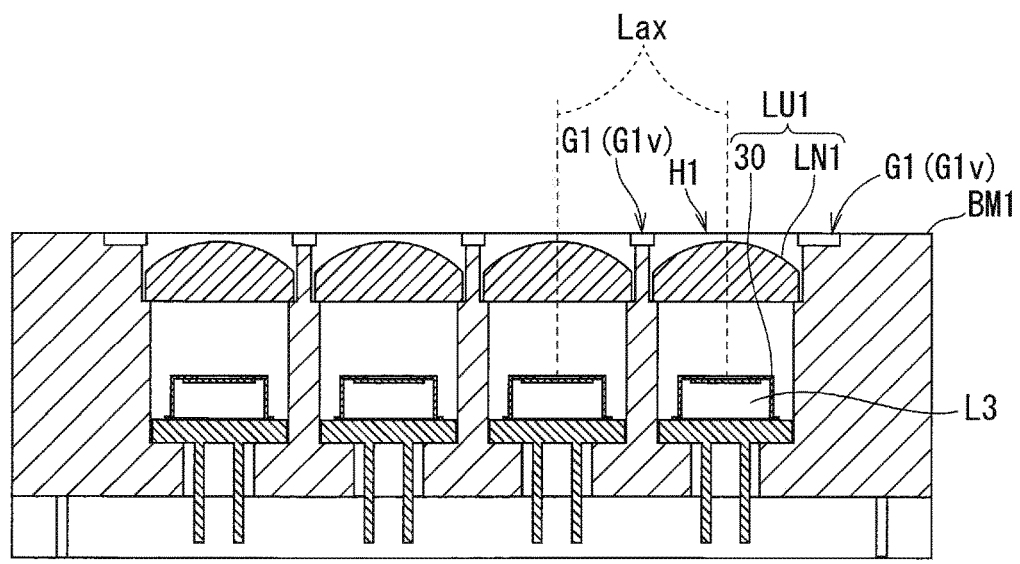
FIG. 2 is a section view of the laser light source device according to the first embodiment of the present invention.

FIG. 2 is a section view of the laser light source device 100 taken along a line A1-A2 in part (a) in FIG. 1. With reference to FIGS. 1 and 2, the laser light source device 100 includes a plurality of optical units LU1, and a base member BM1. FIGS. 1 and 2 exemplarily show eight optical units LU1. Note that, the number of the optical units LU1 is not limited to 8, and may be any of 2 to 7, or may be greater than or equal to 9.

While a detailed description will be given later, as shown in FIG. 3, the optical units LU1 are each a unit that emits laser light LT1 in Z direction. While a detailed description will be given later, the base member BM1 is a member for retaining the optical units LU1. Each of the optical units LU1 is structured by a laser light emitting element 30 and a lens LN1.

The laser light emitting element 30 radially emits the laser light LT1, That is, the angle of divergence of the laser light LT1 is at least one degree.

Figure 4:
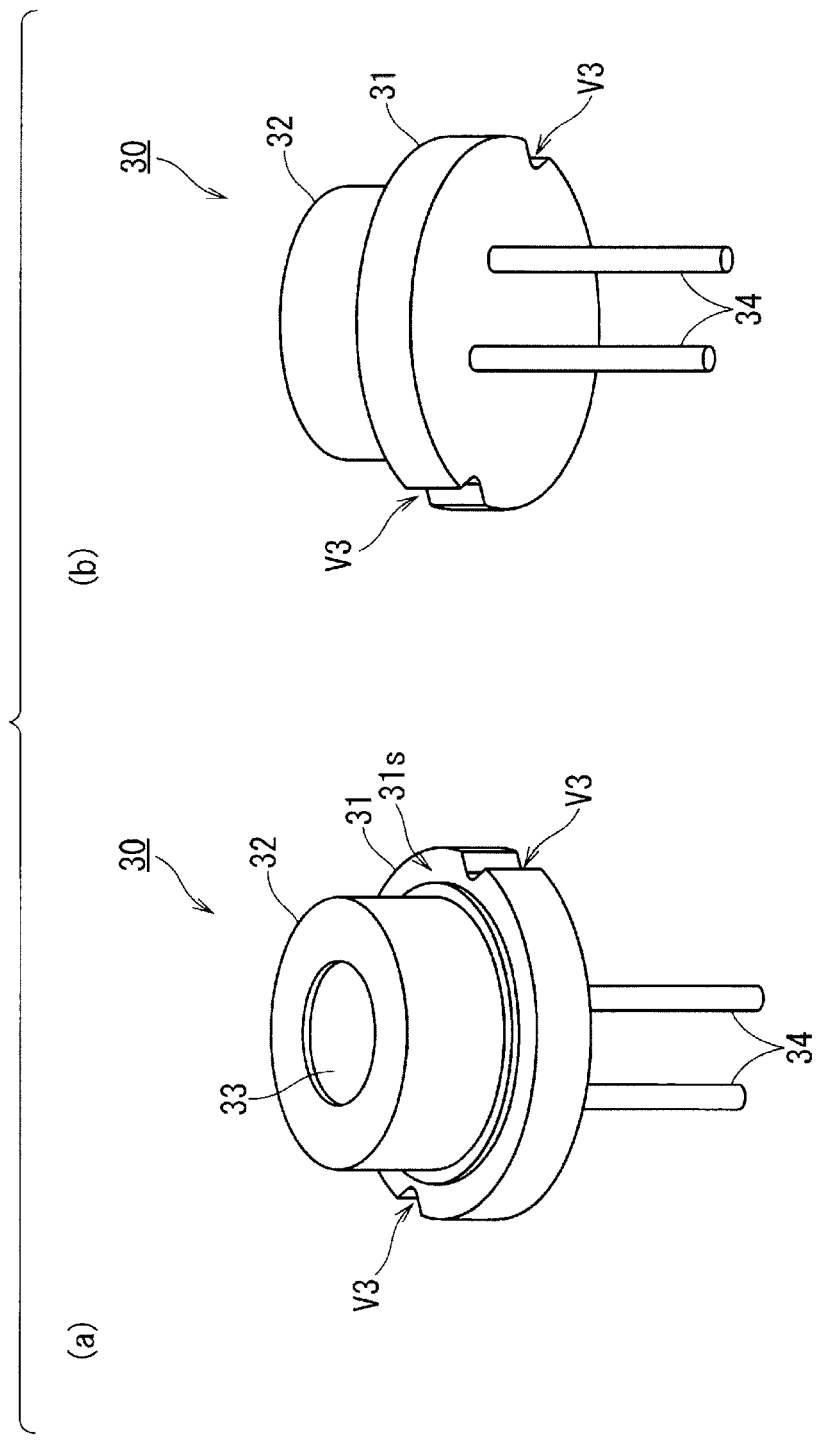
FIG. 4 is a diagram showing the structure of the laser light emitting element according to the first embodiment of the present invention.

FIG. 4 is a diagram showing the structure of the laser light emitting element 30 according to the first embodiment of the present invention. Hereinafter, in the laser light emitting element 30, the surface from which the laser light LT1 is emitted is also referred to as "the light emitting surface". Part (a) in FIG. 4 is a perspective view that mainly shows the light emitting surface of the laser light emitting element 30. Part (b) in FIG. 4 is a perspective view that mainly shows the bottom surface side of the laser light emitting element 30.

With reference to FIG. 2 and parts (a) and (b) in FIG. 4, the laser light emitting element 30 includes a laser element L3, a stem 31, a cap 32, a glass 33, and two lead pins 34.

The laser element L3 is a semiconductor element that emits the laser light LT1. The laser element L3 is formed by, for example, a plurality of point light sources that are linearly arranged (not shown).

The stem 31 is a plate-like member. The stem 31 is, for example, formed by iron. The shape of the stem 31 as seen in a plan view (XY plane) is a circle. The diameter of the circle is, for example, 9 mm. The stem 31 has a main surface 31s. The stem 31 is a member that serves as the reference in determining the direction of the laser light LT1 that the laser element L3 emits, the position of the laser light emitting element 30 and the like. Note that, as shown in FIG. 2, the laser element L3 is provided on the stem 31.

The cap 32 is a member that houses the laser element L3. The cap 32 is fixed to the main surface 31s of the stem 31 by welding, brazing or the like. The cap 32 is structured by, for example, metal. An opening is provided at the upper surface of the cap 32. The glass 33 has light transmission property-. The glass 33 is provided to the cap 32 so as to close the opening of the cap 32.

The lead pins 34 are pins for supplying current to the laser element L3. The lead pins 34 are connected to the laser element L3 penetrating through the stem 31. Note that, the number of the lead pins 34 provided to the laser light emitting element 30 is not limited to two.

The laser light emitting element 30 is provided with notch parts V3. Specifically, a plurality of notch parts V3 are provided at the lateral surface parts of the stem 31 of the laser light emitting element 30. Note that, parts (a) and (b) in FIG. 4 show an exemplary structure in which two notch parts V3 are provided to the stem 31. While a detailed description will be given later, the notch parts V3 are each a constituent for determining the position of the laser light emitting element 30.

Hereinafter, a line that passes through the center of a circle being the shape of the stem 31 as seen in a plan view (XY plane) is also referred to as "the stem center line". The notch parts V3 are provided at two lateral surface parts of the stem 31 that intersect with the stem center line in the stem 31 as seen in a plan view (XY plane), respectively.

The notch parts V3 are each a cutout part for defining the position and disposition angle of the laser light emitting element 30. The shape of each of the notch parts V3 as seen in a plan view (XY plane) is, for example, V-shaped, U-shaped and the like.

Again, with reference to FIGS. 1 and 2, the lens LN1 is provided at the base member BM1 so that the laser light LT1 that the laser light emitting element 30 emits transmits through the lens LN1. The lens LN1 is a lens for rendering the laser light LT1 into collimated light. The lens LN1 is, for example, a collimator lens. The lens LN1 is a convex lens that has a shape rotationally symmetric to an optical axis Lax of the laser light emitting element 30 shown in FIG. 2. The optical axis Lax is the optical axis of the laser light LT1.

Next, a description will be given of the base member BM1. The base member BM1 is structured by metal such as aluminum, for example. The base member BM1 has a main surface BMs which is a flat surface. The main surface BMs is a surface from which the laser light LT1 is emitted (the light emitting surface).

The shape of the base member BM1 is a substantially rectangular parallelepiped. The shape of the base member BM1 as seen in a plan view (XY plane) is elongated (a rectangle). The base member BM1 is provided with holes H1 for retaining the optical units LU1, respectively. Specifically, at the main surface BMs of the base member BM1, the holes H1 are provided as many as the number of the optical units LU1. The holes H1 are each a through hole that penetrate through the base member BM1.

The shape of each of the holes H1 as seen in a plan view (XY plane) is a circle. The optical unit LU1 is inserted into each of the holes H1. That is, the laser light emitting element 30 is inserted into each of the holes H1.

Figure 5:
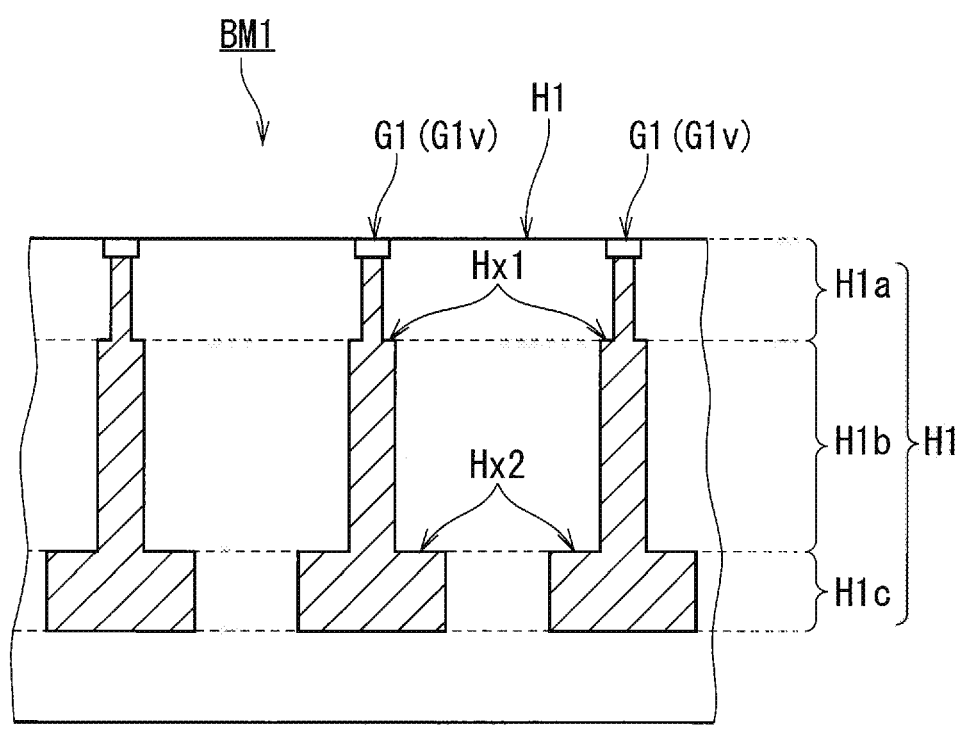
FIG. 5 is a diagram for describing the structure of holes in detail.

FIG. 5 is a diagram for describing the structure of the hole H1 in detail. Specifically, FIG. 5 is an enlarged view of part of the base member BM1 shown in Note that, FIG. 5 does not show the optical unit LU1 so that the structure of the hole H1 can be snore easily visually recognized. Hereinafter, in the base member BM1, a portion in contact with the hole H1 is also referred to as "the hole peripheral part".

The hole H1 is structured so that the diameter of the hole H1 becomes smaller stepwise as nearer to the bottom surface of the base member BM1. Specifically, the hole H1 is structured by holes H1a, H1b, and H1c. The shape of each of the holes H1a, H1b, and H1c is circular cylindrical. The diameter of the hole H1a is greater than the diameter of the hole H1b. The diameter of the hole H1b is greater than the diameter of the hole H1c.

Note that, the shape of the hole H1c is not necessarily circular cylindrical. The shape of the hole H1c may be other shape so long as the two lead pins 34 of the laser light emitting element 30 can penetrate through the hole H1c. The other shape may be, for example, a columnar shape whose cross section is elliptical.

Further, the hole peripheral part is provided with retaining parts Hx1, Hx2. The retaining part Hx1 is a boundary portion between the hole H1a and the hole H1b. The retaining part Hx2 is a boundary portion between the hole H1b and the hole H1c. Each of the retaining parts Hx1, Hx2 functions as a step part at the hole peripheral part. The shape of each of the retaining parts Hx1, Hx2 as seen in a plan view (XY plane) is annular.

As shown in FIG. 2, on the retaining part Hx1, the circumferential part of the lens LN1 is placed. As shown in FIG. 2, on the retaining part Hx2, the laser light emitting element 30 is placed. Specifically, on the retaining part Hx2, the circumferential part of the stem 31 of the laser light emitting element 30 is placed. Thus, the laser light emitting element 30 is retained by the retaining part Hx2. That is, the hole peripheral part is provided with the retaining part Hx2 that retains the laser light emitting element 30 of the optical unit LU1.

Further, with reference to FIG. 1, at the main surface BMs of the base member BM1, holes H2a, H2b are provided. The holes H2a, H2b are holes for determining, in attaching the laser light source device 100 to an attachment-target device (a projector), the position of the laser light source device 100 in the attachment-target device.

Next, a brief description will be given of the operation of the laser light source device 100. With reference to FIGS. 2 and 3, the laser light LT1 emitted by the laser light emitting element 30 (the optical unit LU1) transmits through the lens LN1. Note that, the optical axis of the laser light LT1 is the optical axis Lax shown in FIG. 2. The optical axis Lax of the laser light LT1 from each of the optical units LU1 is parallel to each other.

Note that, as described above, the laser element L3 of the laser light emitting element 30 is structured by a plurality of point light sources that are linearly arranged (not shown). Accordingly, as shown in FIG. 3, the sectional shape of the laser light LT1 is elliptical. Hereinafter, the ellipse being the sectional shape of the laser light LT1 is also referred to as "the ellipse E1".

Each of the optical units LU1 emits the laser light LT1 in Z direction. Accordingly, the major axis of the ellipse E1 corresponding to the laser light LT1 emitted from each of the optical units LU1 is parallel to each other.

Note that, the laser light has the property that the polarized light contained in the laser light can be uniformly oriented with ease (hereinafter referred to as "the property P1"). The property P1 is actively exploited with a projector or the like. Accordingly, precision in polarized light orientation must be strictly managed to attain at least a predetermined degree of precision.

The orientation of the polarized light is equivalent to the orientation of the ellipse E1 corresponding to the laser light LT1 shown in FIG. 3. Accordingly, the orientation of the polarized light is determined by the orientation of the laser element L3 on the stem 31 included in the laser light emitting element 30. The laser element L3 is provided on the stem 31 at the orientation of a predetermined degree of precision. Accordingly, in order to manage the precision in the orientation of the polarized light, the precision in the orientation of the stem 31 relative to the base member BM1 must be managed so that at least a predetermined degree of precision is attained.

Characteristic Structure

Next, a detailed description will be given of the characteristic structure in the present embodiment for satisfying the above-stated requirement (hereinafter also referred to as "the characteristic structure N1"). As described above, the base member BM1 of the laser light source device 100 according to the characteristic structure N1 is provided with the holes H1 for retaining the optical units LU1.

Further, with reference to parts (a) and (b) in FIG. 1, and FIGS. 2 and 5, a guide part G1 is provided at the main surface BMs of the base member BM1. In the characteristic structure N1, the guide part G1 is a recess. The guide part G1 is, for example, a groove. Note that, parts (a) and (b) in FIG. 1 exemplarily show two guide parts G1.

The shape of the guide part G1 as seen in a plan view (XY plane) is elongated. The guide part G1 extends in the long-side direction (X-axis direction) of the base member BM1 as seen in a plan view (XY plane).

Hereinafter, as shown in part (b) in FIG. 1, a line that extends along the long-side direction (X-axis direction) of the guide part G1 and passes through the center in the short-side direction (Y-axis direction) of the guide part G1 is also referred to as "the center line CL". As has been described above, the shape of the hole H1 as seen in a plan view (XY plane) is a circle. Hereinafter, the center of the hole H1 as seen in a plan view (XY plane) is also referred to as "the center C1".

As shown in parts (a) and (b) in FIG. 1, the guide part G1 is provided, for example, to be in contact with four holes H1 juxtaposed to each other in X-axis direction. The guide part G1 is divided into five guide parts G1v by each of the holes H1. That is, the guide part G1 is structured by a plurality of guide parts G1v that are linearly juxtaposed to each other. That is, each of the guide parts G1v is part of the guide part G1. That is, the guide part G1v is a recess (a groove).

The guide part G1v is provided at the main surface BMs of the base member BM1 so as to be in contact with each of the holes H1. Note that, as shown in FIG. 2, two guide parts G1v are in contact with each of the holes H1. That is, the guide parts G1v that are part of the guide part G1 are in contact with each of the holes H1.

Further, as shown in part (b) in FIG. 1, the guide part G1 is provided so that the center line CL does not overlap with the center C1 of the hole H1 as seen in a plan view (XY plane).

Next, a description will be given of a method of assembling the laser light source device 100 (hereinafter also referred to as "the device assembly method N"). In the device assembly method N, a jig 80 is used. The jig 80 is a jig that is used for attaching the laser light emitting element 30 to the base member BM1. Specifically, the jig 80 is a jig for inserting the laser light emitting element 30 into the hole H1 of the laser light source device 100 (the base member BM1).

Figure 6:
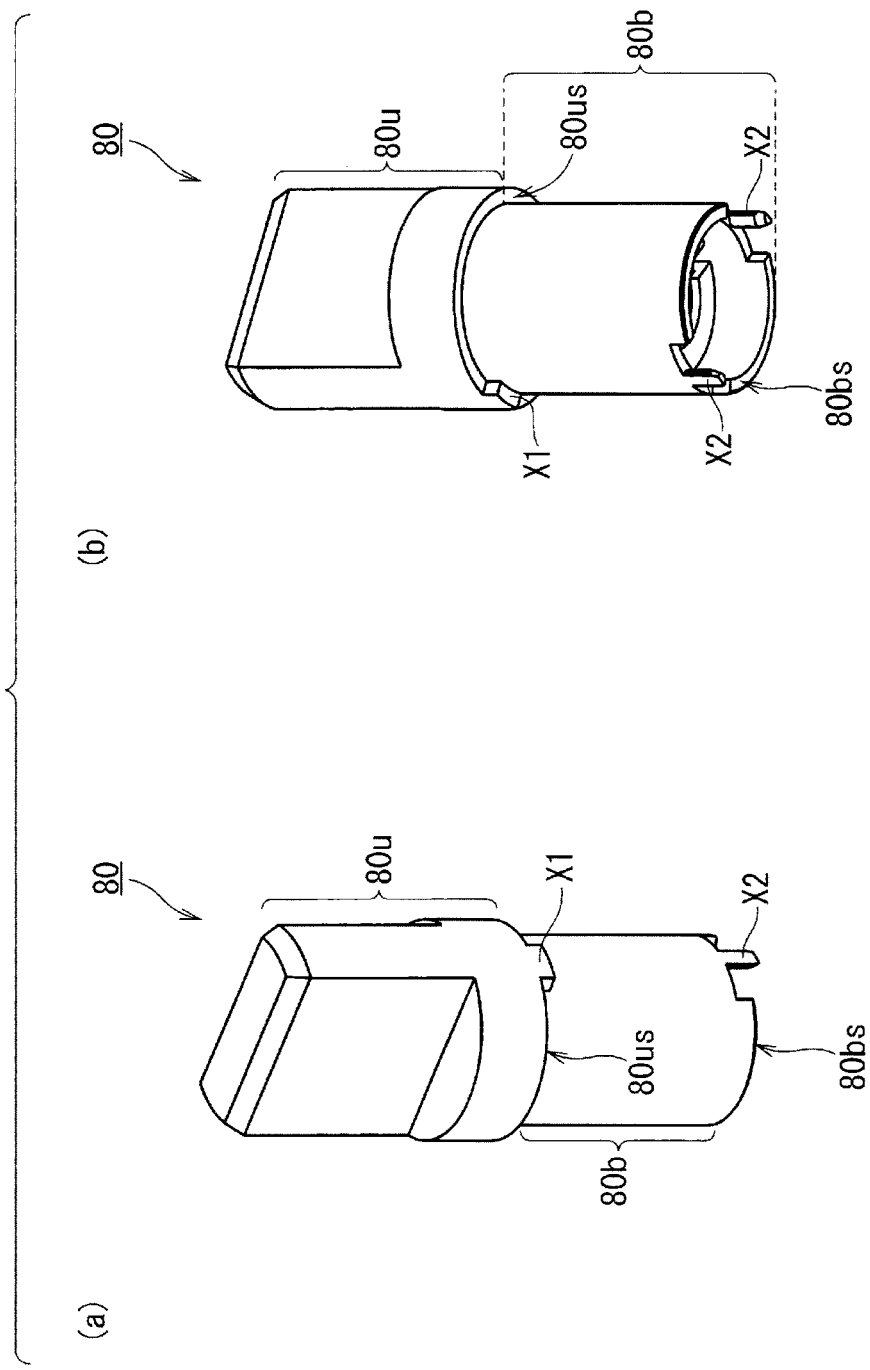
FIG. 6 is a diagram showing the structure of a jig.

FIG. 6 is a diagram showing the structure of the jig 80. Part (a) in FIG. 6 is a perspective view for clearly showing the upper structure of the jig 80. Part (b) in FIG. 6 is a perspective view for clearly showing the lower structure of the jig 80.

With reference to parts (a) and (b) in FIG. 6, the shape of the jig 80 is substantially circular cylindrical. The jig 80 includes a knob part 80u and a circular cylindrical part 80b. The knob part 80u is the part for the operator to hold. The knob part 80u has a bottom surface 80us. The shape of the bottom surface 80us as seen in a plan view (XY plane) is a circle. The size of the bottom surface 80us as seen in a plan view (XY plane) is greater than the size of the hole H1 as seen in a plan view (XY plane).

The circular cylindrical part 80b is a portion inserted into the hole H1 of the base member BM1. The circular cylindrical part 80b has a shape which allows the circular cylindrical part 80b to be inserted into the hole H1. The shape of the circular cylindrical part 80b is substantially circular cylindrical. The circular cylindrical part 80b has a bottom surface 80bs. The shape of the bottom surface 80bs is annular.

Hereinafter, the state in which the circular cylindrical part 80b of the jig 80 is inserted into the hole H1 of the base member BM1 is also referred to as "the jig-inserted state".

FIG. 7 is a diagram showing the structure in the jig-inserted state. FIG. 7 exemplarily shows the state in which eight jigs 80 are inserted into eight holes H1 of the base member BM1, respectively.

With reference to FIGS. 6 and 7, in the jig-inserted state, the bottom surface 80us of the knob part 80u is in contact with the main surface BMs of the base member BM1.

Again, with reference to parts (a) and (b) in FIG. 6, the jig 80 includes a projection X1 and two projections X2 (claw parts).

The projection X1 is provided at an end of the bottom surface 80us of the knob part 80u. The projection X1 has a shape for fitting with the guide part G1v (G1). The projection X1 is part of the jig 80. That is, the guide part G1v (G1) has a shape for fitting with the projection X1 which is part of the jig 80. In the jig-inserted state, the projection X1 of the jig 80 fits with the guide part G1v. Note that, the number of the projection X1 provided at the jig 80 is not limited to one, and may be two or more.

The projection X2 is part of the jig 80. The projections X2 have a shape for fitting with the notch part V3 of the stem 31. The projection X2 is provided at the lower part of the circular cylindrical part 80b.

Hereinafter, the force for drawing the cap 32 of the laser light emitting element 30 to the lower part of the circular cylindrical part 80b of the jig 80 is also referred to as "the drawing force Pw1". Further, hereinafter, the device that has the function of generating the drawing force Pw1 is also referred to as "the force generating device".

The force generating device is structured so as to he operable for the operator. The force generating device is, for example, a device that uses an electromagnet. In this case, by being operated by the operator, the force generating device generates magnetic force from the electromagnet, thereby generating the drawing force Pw1. Thus, the cap 32 of the laser light emitting element 30 is drawn to the lower part of the circular cylindrical part 80b of the jig 80.

Further, by being operated by the operator, the force generating device can also stop generating magnetic force from the electromagnet, thereby extinguishing the generated drawing force Pw1. The force generating device is provided, for example, inside the jig 80.

Note that, the force generating device may be, for example, a suction device or the like that has a function of suctioning air.

The projection X2 of the jig 80 is structured to fit with the notch part V3 of the stern 31. Hereinafter, the state in which the projection X2 of the jig 80 fits with the notch part V3 of the stem 31 is also referred to as "the fit state StJ". Further, hereinafter, the precision of the projection X2 fitting with the notch part V3 is also referred to as "the fit precision".

Figure 8:
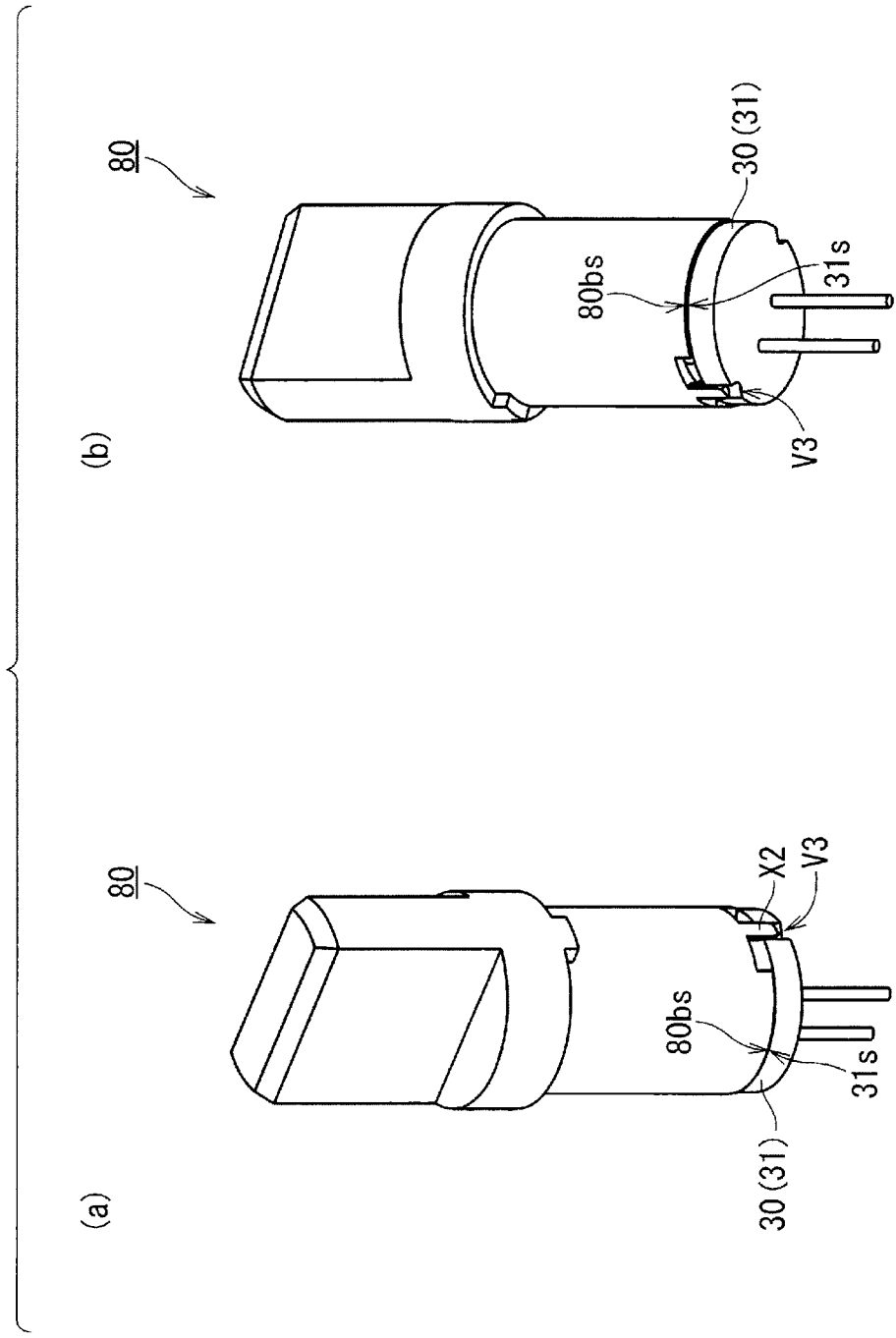
FIG. 8 is a diagram showing the jig in a fit state StJ.

FIG. 8 is a diagram showing the jig 80 in the fit StJ. Part (a) in FIG. 8 is a perspective view of the jig 80 in the fit state StJ as seen at the angle identical to part (a) in FIG. 6. Part (b) in FIG. 8 is a perspective view of the jig 80 in the fit state StJ as seen at the angle identical to part (b) in FIG. 6.

Note that, the projection X2 and the notch part V3 are structured so as not to maintain the fit state StJ in the case where the drawing force Pw1 is not generated in the fit state StJ. For example, the projection X2 and the notch part V3 are structured so that a slight clearance exists between the projection X2 and the notch part V3 in the fit state StJ.

Further, in the fit state StJ, the bottom surface 80bs of the jig 80 is in contact with the main surface 31s of the stem 31.

Next, a description will be given of each of the steps in the device assembly method N. In the device assembly method N, firstly, a gripping step is performed. In the gripping step, the operator presses the jig 80 against the laser light emitting element 30 so that the projection X2 of the jig 80 fits with the notch part V3 of the laser light emitting element 30. Thus, the projection X2 being part of the jig 80 fits with the notch part V3. As a result, the jig 80 attains the fit state StJ. Note that, the notch part V3 is a portion which fits with the projection X2 by, in an inserting step which will be described later, the laser light emitting element 30 being inserted into the hole H1 by the jig 80.

In the fit state StJ, the orientation of the laser light emitting element 30 relative to the jig 80, that is, the orientation of the notch part V3 relative to the optical axis of the laser light emitting element 30 is determined by the fit precision. Further, in the fit state StJ, the position of the laser light emitting element 30 in the plumb direction (the vertical direction) relative to the jig 80 is determined by the fit precision.

Then, the operator operates the force generating device so that the force generating device of the jig 80 generates the drawing force Pw1. By the generated drawing force Pw1, the fit state StJ is maintained. That is, the jig 80 maintains the state in which the laser light emitting element 30 is gripped. Note that, the operator repeatedly performs operations similar to those described above, thereby providing the jig 80 in the fit state StJ as many as the number of the holes H1 of the base member BM1.

Note that, solder is provided at the retaining part Hx2 of each of the holes H1 of the base member BM1.

Next, the inserting step is performed. In the inserting step, the operator performs an operation of inserting the circular cylindrical part 80b of the jig 80 into the hole H1 so that the projection X1 of the jig 80 in the fit state StJ fits with the guide part G1v (G1) of the base member BM1. Then, the operator operates the force generating device so as not to allow the force generating device of the jig 80 to generate the drawing force Pw1. The operator repeatedly performs the foregoing operations as many times as the number of the holes H1.

Thus, the laser light emitting element 30 is inserted into each of the holes H1. That is, the laser light emitting element 30 is an element inserted into the hole H1 by the jig 80. Further, the guide part G1v (G1) fits with the projection X1 when the laser light emitting element 30 is inserted into the hole H1 by the jig 80. Further, by the projection X1 fitting with the guide part G1v, the position and orientation of the laser light emitting element 30 in the hole H1 are determined. That is, the guide part G1v (G1) is used in order to determine the position and orientation of the laser light emitting element 30 in the hole H1.

By the circular cylindrical part 80b (the laser light emitting element 30) of the jig 80 being inserted into each of the holes H1, the base member BM1 attains the state shown in FIG. 7.

Note that, the jig 80 is structured so that the stem 31 of the laser light emitting element 30 is placed on the retaining part Hx2 of the hole H1 in the case where the state of the jig 80 is the fit state StJ and the jig-inserted state. Further, since the force generating device of the jig 80 is not generating the drawing force Pw1, by the inserting step, the stem 31 of the laser light emitting element 30 is placed on the retaining part Hx2 of each of the holes H1 via solder.

Accordingly, by the inserting step, the orientation of each of the jigs 80 relative to the base member BM1 becomes uniform as shown in FIG. 7.

The orientation of the laser light emitting element 30 relative to the jig 80 is determined by the position of the projection X2 and the notch part V3. Therefore, the orientation of each of the jigs 80 corresponds to the orientation of the laser light emitting element 30. Accordingly, by the inserting step, the orientation of each of the laser light emitting elements 30 relative to the base member BM1 is determined.

Note that, the attachment precision of each of the laser light emitting elements 30 to the base member BM1 is managed to attain the required precision, by managing the fit precision of the projection X2 relative to the notch part V3 and the fit precision of the projection X1 relative to the guide part G1v (G1).

Note that, as described above, in part (b) in FIG. 1, the guide part G1 is provided so that its center line CL does not overlap with the center C1 of the hole H1 as seen in a plan view (XY plane). Further, the guide part G1 is structured by a plurality of guide parts G1v that are linearly juxtaposed to each other. Accordingly, in the inserting step, the projection X1 will not fit with the guide part G1v of the base member BM1 with the orientation of the jig 80 being inverted by 180 degrees relative to a desired orientation. This structure can prevent troubles such as the operator's mistaking the polarity of the lead pins 34 of the laser light emitting element 30.

Subsequent to the inserting step, a fixing step is performed. In the fixing step, in the state shown in FIG. 7, pressure is applied to each of the jigs 80 so that a predetermined pressure is applied to each of the laser light emitting elements 30. Then, in order to melt the solder existing between the retaining part Hx2 and the stem 31 of the laser light emitting element 30, the base member BM1 (the laser light source device 100) is heated. The heating is performed using, for example, a high temperature furnace.

Note that, in order to melt the solder, a process of heating the lower part of the base member BM1 (that is, the surface of the base member BM1 on the side opposite to the main surface BMs) may be performed with a heater.

Thus, the stem 31 of the laser light emitting element 30 is precisely fixed to the retaining part Hx2 via the solder.

Note that, it is also possible to employ the structure using an adhesive agent as the material that fixes the stem 31 to the retaining part Hx2. In this structure, an adhesive agent is applied to the retaining part Hx2 of each of the holes H1 of the base member BM1. Then, similarly to the inserting step, the laser light emitting element 30 is inserted into each of the holes H1 by the jig 80. Thus, the stem 31 of the laser light emitting element 30 is placed on the retaining part Hx2 of the hole H1 via the adhesive agent.

Thereafter, a curing process for curing the adhesive agent is performed. The curing process is performed, for example, in a curing bath. Thus, the stem 31 of the laser light emitting element 30 is precisely fixed to the retaining part Hx2 via the adhesive agent.

Subsequent to the fixing step, a lens fixing step is performed. In the lens fixing step, the lens LN1 is placed on the retaining part Hx1 of each of the holes H1. Then, the surrounding of the lens LN1 is filled with an adhesive agent. Next, a process for curing the adhesive agent is performed. Thus, the lens LN1 is fixed to the retaining part Hx1 of each of the holes H1. Thus, each of the steps of the device assembly method N is finished. By the device assembly method N, the assembly of the laser light source device 100 is completed.

As has been described above, according to the present embodiment, the optical unit LU1 is retained by the hole H1 provided at the base member BM1. The optical unit LU1 is structured by the laser light emitting element 30 and the lens LN1. Accordingly, the hole H1 provided at the base member BM1 has a function of retaining the laser light emitting element 30 as a light source. Note that, the laser light emitting element 30 is a light source that emits the laser light LT1.

Thus, with the structure that fixes the laser light emitting element 30 being light source to the base member BM1, the necessity of providing any separate member as in the conventional techniques is eliminated. Accordingly, the number of components of the structure that fixes the light source (the laser light emitting element 30) to the base member BM1 can be minimized.

Further, to the base member BM1, the guide part G1 (G1v) for determining the position of the laser light emitting element 30 in the hole H1 of the base member BM1 is provided.

From the foregoing, with a minimum number of components of the structure that fixes the light source (the laser light emitting element 30) to the base member BM1, the position of the light source at the base member BM1 can be determined.

Further, according to the present embodiment, the circular cylindrical part 80b of the jig 80 is inserted into the hole H1 so that the projection X1 of the jig 80 in the fit state StJ fits with the guide part G1v of the base member BM1. Thus, the position and orientation of the laser light emitting element in the hole H1 can be determined highly precisely. Accordingly, the laser light source device 100 which is highly precisely structured can be provided.

Still further, according to the present embodiment, the laser light emitting element 30 can be attached to the base member BM1 highly precisely. Accordingly, the optical alignment of the laser light emitting element 30 can be dispensed with.

Still further, according to the present embodiment, the number of components of the structure that fixes the light source to the base member BM1 can be reduced and, therefore, an inexpensive and lightweight laser light source device 100 can be provided.

Still further, according to the present embodiment, the guide part G1 is provided so that the center line CL does not overlap with the center C1 of the hole H1 as seen in a plan view (XY plane). This structure can prevent, as described above, troubles such as the operator's mistaking the polarity of the lead pins 34 of the laser light emitting element 30. This structure can also prevent the operator's mistaking the orientation of the laser light emitting element 30.

Note that, the guide part G1v may be used for the purpose other than the positioning of the laser light emitting element 30. The guide part G1v may be used, for example, for positioning the laser light source device 100 in attaching the laser light source device 100 to the attachment-target device. This eliminates the necessity of separately providing a hole for positioning the laser light source device 100.

Further, according to the present embodiment, the guide part G1v provided at the main surface BMs of the base member BM1 is a recess. Therefore, the surface area of the base member BM1 can be increased by the guide part G1v. Accordingly, the cooling efficiency of the base member BM1 (the laser light source device 100) can be improved. Further, the improved cooling efficiency can increase the life of the laser light emitting element 30 of the laser light source device 100.

Note that, while it has been described that the number of the optical units LU1 is two or more, the number is not limited thereto, and the number of the optical units LU1 may be one. Further, the number of the holes H1 of the base member BM1 may be one.

Note that, the above-described related arts A, B have a problem that the number of required components of the structure that fixes the light source to the base member is great.

Addressing thereto, the laser light source device 100 of the present embodiment is structured as above. Thus, the structure of the laser light source device 100 according to the present embodiment can solve the problems described above.

<Second Embodiment>

The structure of the present embodiment is a structure in which the guide part is a projection (hereinafter also referred to as "the modified structure A1"). Hereinafter, the laser light source device adopting the modified structure A1 is also referred to as "the laser light source device 100A".

Figure 9:
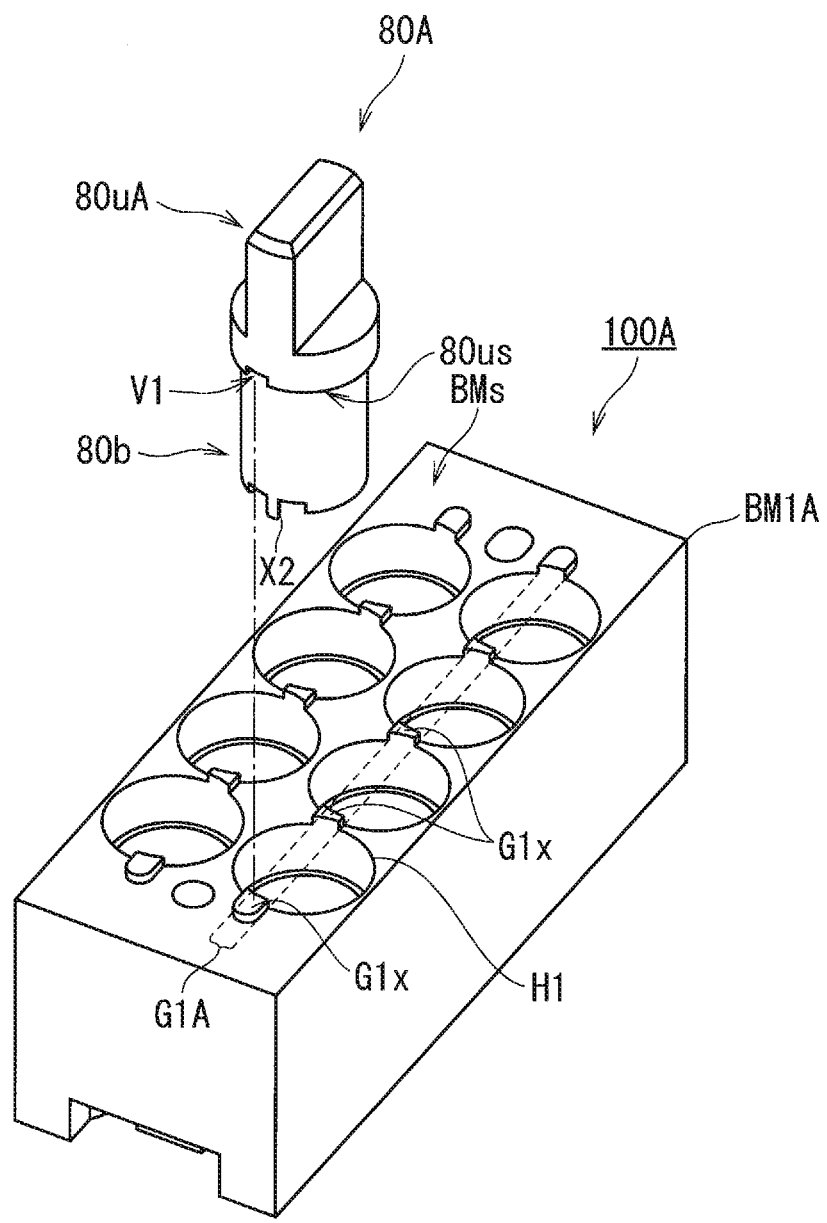
FIG. 9 is a perspective view of a laser light source device according to a second embodiment of the present invention.

FIG. 9 is a perspective view of the laser light source device 100A according to the second embodiment of the present invention. Note that, FIG. 9 also shows a jig 80A which will be described later. With reference to FIG. 9, the laser light source device 100A is different from the laser light source device 100 in including a base member BM1A in place of the base member BM1. The rest of the structure of the laser light source device 100A is similar to that of the laser light source device 100 and, therefore, the detailed description thereof will not be repeated.

The base member BM is different from the base member BM1 in being provided with a guide part G1A in place of the guide part G1. The rest of the structure of the base member BM1A is similar to that of the base member BM1 and, therefore, the detailed description thereof will not be repeated. That is, the shape of the base member BM1A as seen in a plan view (XY plane) is elongated (a rectangle).

Hereinafter, a line that extends along the long-side direction (X-axis direction) of the guide part G1A and that passes through the center of the short-side direction (Y-axis direction) of the guide part G1A is also referred to as "the center line CL".

The guide part G1A is provided at the main surface BMs of the base member BM1A. The guide part G1A is a projection that projects in the Z direction from the main surface BMs. Note that, FIG. 9 exemplarily shows two guide parts G1A.

Note that, the shape of the guide part G1A as seen in a plan view (XY plane) is elongated. The guide part G1A extends along the long-side direction (X-axis direction) of the base member BM1A as seen in a plan view (XY plane).

The guide part G1A is provided, for example, to be in contact with four holes H1 juxtaposed to each other in X-axis direction. The guide part G1A is divided into five guide parts G1x by each of the holes H1. That is, the guide part G1A is structured by a plurality of guide parts G1x that are linearly juxtaposed to each other. That is, each of the guide parts G1x is part of the guide part G1A. That is, the guide part G1x is a projection. That is, the guide part G1v is provided at the main surface BMs of the base member BM so as to be in contact with each of the holes H1. Note that, as shown in FIG. 9, two guide parts G1x are in contact with each of the holes H1. That is, the guide parts G1x which are part of the guide part G1A are in contact with each of the holes H1.

Further, similarly to the guide part G1 according to the first embodiment, the guide part G1A is provided so that the center line CL of the guide part G1A does not overlap with the center C1 of the hole H1 as seen in a plan view (XY plane).

The guide part G1x (G1A) is structured as part of the base member BM1A, for example, when the base member BM1A is manufactured. Note that, the guide part G1x (G1A) may be a member attached to the base member BM1A using, for example, an adhesive agent or the like.

Next, a description will be given of a method of assembling the laser light source device 100A (hereinafter also referred to as "the device assembly method A"). In the device assembly method A, a jig 80A shown in FIG. 9 is used.

The jig 80A is different from the jig 80 shown in FIG. 6 in including a knob part 80uA in place of the knob part 80u. The rest of the structure and function of the jig 80A are similar to those of the jig 80 and, therefore, the detailed description thereof will not be repeated.

The knob part 80uA is different from the knob part 80u in including a recess V1 in place of the projection X1. That is, the jig 80A includes the recess V1. The rest of the structure of the knob part 80uA is similar to that of the knob part 80u and, therefore, the detailed description thereof will not be repeated.

Hereinafter, the state in which the circular cylindrical part 80b of the jig 80A is inserted into the hole H1 of the base member BM1A is also referred to as "the jig-inserted state".

The recess V1 is provided at an end of the bottom surface 80us of the knob part 80uA. The recess V1 has a shape for fitting with the guide part G1x (G1A). The recess V1 is part of the jig 80A. That is, the guide part G1x (G1A) has a shape for fitting with the recess V1 which is part of the jig 80A.

Note that, in the jig-inserted state, the recess V1 of the jig 80A fits with the guide part G1x (G1A). Note that, the number of the recess V1 provided at the jig 80A is not limited to one, and may be two or more.

Hereinafter, the state in which the projection X2 of the jig 80A fits with the notch part V3 of the stem 31 is also referred to as "the fit state StJ". The fit state SU has been described in the first embodiment and, therefore, the detailed description thereof will not be repeated.

Next, a description will be given of each of the steps in the device assembly method A. In the device assembly method A, firstly, a gripping step A is performed. The gripping step A is performed similarly to the gripping step according to the first embodiment, except that the jig 80 is replaced by the jig 80A and, therefore, the detailed description thereof will not be repeated. By the gripping step A, the jig 80A in the fit state StJ is provided as many as the number of the holes H1 of the base member BM1A.

Similarly to the first embodiment, the notch part V3 of the laser light emitting element 30 is a portion that fits with the projection X2, for the laser light emitting element 30 to be inserted into the hole H1 by the jig 80A in an inserting step A which will be described later.

Next, the inserting step A is performed. In the inserting step A, a process similar to that in the inserting step according to the first embodiment is performed. A brief description thereof will be described in the following. In the inserting step A, the operator performs an operation of inserting the circular cylindrical part 80b of the jig 80A into the hole H1 so that the recess V1 of the jig 80A in the fit state StJ fits with the guide part G1x (G1A) of the base member BM1A. Then, the operator performs an operation of operating the force generating device so as not to allow the force generating device of the jig 80A to generate the drawing force Pw1. The operator repeatedly performs the foregoing operations as many times as the number of the holes H1.

Thus, the laser light emitting element 30 is inserted into each of the holes H1. That is, the laser light emitting element 30 is an element inserted into the hole H1 by the jig 80A. Further, the guide part G1x (G1A) fits with the recess V1 when the laser light emitting element 30 is inserted into the hole H1 by the jig 80A. Further, by the guide part G1x fitting with the recess V1, the position and orientation of the laser light emitting element 30 in the hole H1 are determined. That is, the guide part G1x (G1A) is used in order to determine the position and orientation of the laser light emitting element 30 in the hole H1.

Then, similarly to the first embodiment, the fixing step and the lens fixing step are performed. Thus, the assembly of the laser light source device 100A is finished.

As has been described above, the modified structure A1 according to the present embodiment also exhibits the effect similar to that the first embodiment exhibits.

<Third Embodiment>

The guide part according to each of the first and second embodiments extends along the long-side direction of the base member. A guide part according to the present embodiment has the structure extending in the short-side direction of the base member as seen in a plan view (XY plane) (hereinafter also referred to as "the modified structure B1"). Hereinafter, the structure in which the modified structure B1 is applied to the characteristic structure N1 according to the first embodiment is also referred to as "the modified structure Nb". Further, hereinafter, the laser light source device adopting the modified structure Nb is also referred to as "the laser light source device 100B". Still further, hereinafter, the base member adopting the modified structure Nb is also referred to as "the base member BM1B".

Figure 10:
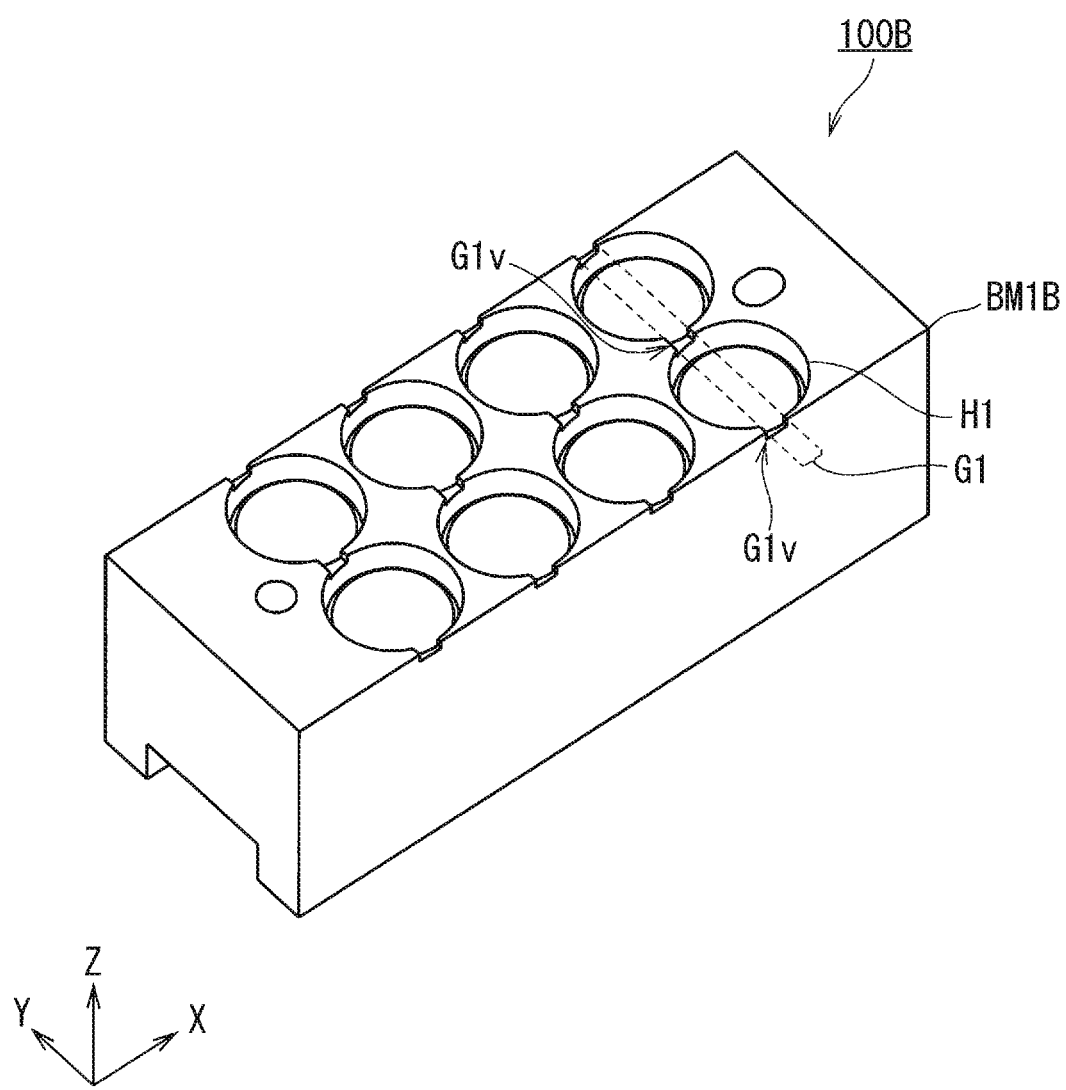
FIG. 10 is a perspective view of a laser light source device according to a third embodiment of the present invention.

FIG. 10 is a perspective view of the laser light source device 100B according to the third embodiment of the present invention. With reference to FIG. 10, the laser light source device 100B is different from the laser light source device 100 in including the base member BM1B in place of the base member BM1. The rest of the structure of the laser light source device 100B is similar to that of the laser light source device 100 and, therefore, the detailed description thereof will not be repeated.

The base member BM1B is different in the extending direction of each of the guide parts G1 from the base member BM1 shown in part (a) in FIG. 1. The rest of the structure of the base member BM1B is similar to that of the base member BM1 and, therefore, the detailed description thereof will not be repeated. Note that, the structure and shape of the guide part G1 in the modified structure Nb are similar to those of the guide part G1 in the above-described characteristic structure N1 and, therefore, the detailed description thereof will not be repeated. In the modified structure Nb, the shape of the base member BM1B as seen in a plan view (XY plane) is elongated (a rectangle).

In the base member BM1B, the shape of the guide part G1 as seen in a plan view (XY plane) is elongated, The guide part G1 of the base member BM1B extends along the short-side direction (Y-axis direction) of the base member BM1B as seen in a plan view (XY plane). Note that, FIG. 10 exemplarily shows four guide parts G1 that extend along the short-side direction (Y-axis direction) of the base member BM1B.

In the base member BM1B, each of the guide parts G1 is provided to be in contact with two holes H1 juxtaposed to each other in Y-axis direction. Each of the guide parts G1 is divided into three guide parts G1v by each of the holes H1. That is, the guide part G1 is structured by a plurality of guide parts G1v that are linearly juxtaposed to each other. Further, similarly to the first embodiment, the guide part G1 is provided so that the center line CL of the guide part G1 does not overlap with the center C1 of the hole H1 as seen in a plan view (XY plane).

Note that, the assembly of the laser light source device 100B with the modified structure Nb is performed using the jig 80 similarly to the first embodiment and, therefore, the detailed description thereof will not be repeated. The modified structure Nb also exhibits the effect similar to that the first embodiment exhibits.

Hereinafter, the structure in which the modified structure B1 is applied to the modified structure A1 according to the second embodiment is also referred to as "the modified structure Ab". Hereinafter, the laser light source device adopting the modified structure Ab is also referred to as "the laser light source device 100Ab". Further, hereinafter, the base member adopting the modified structure Ab is also referred to as "the base member BM1Ab".

The base member BM1Ab of the laser light source device 100Ab (not shown) is different from the base member BM1A shown in FIG. 9 in that the guide part G1A extends along the short-side direction (Y-axis direction) of the base member BM1A as seen in a plan view (XY plane). The rest of the structure of the base member BM1Ab is similar to that of the base member BM1A and, therefore, the detailed description thereof will not be repeated.

In the base member BM1Ab of the modified structure Ab, each of the guide parts G1A is provided to be in contact with two holes H1 juxtaposed to each other in Y-axis direction. Each of the guide parts G1A is divided into three guide parts G1x by each of the holes H1. That is, the guide part G1A is structured by a plurality of guide parts G1x that are linearly juxtaposed to each other. Further, in the modified structure Ab, similarly to the first embodiment, the guide part G1A is provided so that the center line CL of the guide part G1A does not overlap with the center C1 of the hole H1 as seen in a plan view (XY plane).

Note that, in the assembly of the laser light source device 100Ab with the modified structure Ab is performed using the jig 80A similarly to the second embodiment and, therefore, the detailed description thereof will not be repeated. The modified structure Ab also exhibits the effect similar to that the first embodiment exhibits.

Note that, in the present invention, the embodiments may be freely combined, modified, or omitted as appropriate within the scope of the invention.

While the present invention has been described in detail, the description above is of an exemplary nature as to all the embodiments, and the present invention is not limited thereto. It is construed that numerous modifications which have not been exemplarily shown can be expected without deviating from the scope of the present invention.

EXPLANATION OF REFERENCE SIGNS

30: laser light emitting element
80, 80A: jig
100, 100A, and 100B: laser light source device
BM1, BM1A, and BM1B: base member
G1, G1A, G1v, and G1x: guide part
LN1: lens
LU1: optical unit
X1, X2: projection

The invention claimed is:

1. A laser light source device comprising:
an optical unit that emits laser light; and
a base member, wherein
said optical unit includes a laser light emitting element that emits said laser light, and a lens through which the laser light transmits,
said base member is provided with a hole for retaining said optical unit, said base member is further provided with a guide part used for determining a position of said laser light emitting element in said hole,
a portion in said base member that is in contact with said hole is provided with a retaining part that retains said laser light emitting element of said optical unit,
said guide part and said hole are provided at a main surface of said base member,
said guide part is in contact with said hole,
said laser light emitting element is inserted into said hole,
said laser light emitting element is an element that is inserted into said hole by a jig for inserting the laser light emitting element into said hole,
said guide part has a shape for fitting with a portion of said jig,
a shape of said guide part as seen in a plan view is elongated,
a shape of said hole as seen in a plan view is a circle, and
said guide part is provided at said base member so as to extend along a long-side direction of the guide part and so as to prevent a center line that passes through a center in a short-side direction of the guide part from overlapping with a center of said hole as seen in a plan view.

2. The laser light source device according to claim 1, wherein
the portion of said jig that fits with said guide part is a projection, and
said guide part is a recess that fits with said projection when said laser light emitting element is inserted into said hole by said jig.

3. The laser light source device according to claim 1, wherein
the portion of said jig that fits with said guide part is a recess, and
said guide part is a projection that fits with said recess when said laser light emitting element is inserted into said hole by said jig.

4. The laser light source device according to claim 3, wherein said guide part is a member that is attached to said base member.

5. The laser light source device according to claim 1, wherein said laser light emitting element is provided with a notch part that fits with other portion of said jig, for the laser light emitting element to be inserted into said hole by said jig.

6. The laser light source device according to claim 1, wherein
- a shape of said base member as seen in a plan view is elongated,
- a shape of said guide part as seen in a plan view is elongated, and
- said guide part extends along a long-side direction of said base member as seen in a plan view.

7. The laser light source device according to claim 1, wherein
- a shape of said base member as seen in a plan view is elongated,
- a shape of said guide part as seen in a plan view is elongated, and
- said guide part extends along a short-side direction of said base member as seen in a plan view.

* * * * *